(12) United States Patent
Takagi et al.

(10) Patent No.: US 6,727,042 B2
(45) Date of Patent: Apr. 27, 2004

(54) PHOTOSENSITIVE RESIN COMPOSITION

(75) Inventors: Toru Takagi, Gunma (JP); Mitsuhiro Yada, Gunma (JP); Takeshi Saitou, Gunma (JP)

(73) Assignee: Showa Highpolymer Co., Ltd., Tokyo (JP)

( * ) Notice: Subject to any disclaimer, the term of this patent is extended or adjusted under 35 U.S.C. 154(b) by 0 days.

(21) Appl. No.: 10/169,927

(22) PCT Filed: Dec. 27, 2000

(86) PCT No.: PCT/JP00/09333

§ 371 (c)(1),
(2), (4) Date: Jul. 11, 2002

(87) PCT Pub. No.: WO01/53890

PCT Pub. Date: Jul. 26, 2001

(65) Prior Publication Data

US 2003/0087189 A1 May 8, 2003

(30) Foreign Application Priority Data

Jan. 17, 2000 (JP) ........................................ 2000-008082

(51) Int. Cl.$^7$ ........................ C03F 7/027; C08G 59/14; H05K 3/28
(52) U.S. Cl. .................... 430/280.1; 522/100; 522/103; 430/311
(58) Field of Search ........................ 430/280.1; 522/100, 522/103

(56) References Cited

U.S. PATENT DOCUMENTS 5,538,821 A * 7/1996 Kakinuma et al. ....... 430/280.1

FOREIGN PATENT DOCUMENTS

JP         6-324490 A       11/1994

OTHER PUBLICATIONS

Morrison et al, Organic Chemistry, Third Edition, Allyn and jBacon, Inc, Boston, Mass., 1973, pp. 492–493.*
Grant et al, Grant & Hackh's Chemical Dictionary, fifth edition, Mc Graw–Hill Book company, New York, N.Y, 1987, p. 454, "pivalic acid".*
RN 4767–03–7, Registry, STN online, ACS on STN, "dimethylolpropionic acid", one page, 2003.*
RN 3739–30–8, Registry, STN online, ACS on STN, "2–hydroxy–2–methylbutyric acid", one page, 2003.*
RN 600–15–7, Registry, STN online, ACS on STN, "2–hydroxybutyric acid", one page, 2003.*
RN 75–98–9, Registry, STN online, ACS on STN, "pivalic acid", one page, 2003.*

* cited by examiner

Primary Examiner—Cynthia Hamilton
(74) Attorney, Agent, or Firm—Sughrue Mion, PLLC

(57) ABSTRACT

A photosensitive resin composition according to the invention includes (A) a photosensitive resin, (B) an epoxy resin, (C) a photopolymerization initiator, and (D) a polymerizable unsaturated compound and/or a solvent, which photosensitive resin (A) is obtained by allowing an epoxy resin (a) to react with a compound (b) having one primary alcoholic hydroxyl group and one functional group selected from a carboxyl group and a secondary amino group per molecule and an unsaturated monobasic acid (c) to yield a reaction product (I) and allowing a saturated or unsaturated polybasic acid anhydride (d) to react with the reaction product (I). The photosensitive resin composition of the invention is used as a solder resist in printed circuit boards, can be satisfactorily developed in a dilute basic aqueous solution and can yield a cured film that is excellent in flexibility, water resistance, adhesion, solder heat resistance, electroless gold plating resistance and pressure cooker test (PCT) resistance.

10 Claims, No Drawings

PHOTOSENSITIVE RESIN COMPOSITION

TECHNICAL FIELD

The present invention relates to a photosensitive resin composition which is used as a solder resist in printed circuit boards, can be satisfactorily developed in a dilute basic aqueous solution and can yield a cured film that is excellent in flexibility, water resistance, adhesion, solder heat resistance, electroless gold plating resistance, pressure cooker test (PCT) resistance and other properties.

BACKGROUND ART

To pattern resists on printed circuit boards, screen printing has been conventionally used in many cases. However, a photosensitive resin that can be developed in a dilute basic solution as described in Japanese Examined Patent Application Publication No. 1-54390 is now used to improve productivity. This photosensitive resin is a novolak epoxy (meth)acrylate that has a carboxyl group in a side chain and is obtained by allowing acrylic acid as an unsaturated monobasic acid to react with a novolak epoxy resin and allowing a saturated or unsaturated polybasic acid anhydride to react with the resulting hydroxyl group.

With increasing performances of electronic equipment, further downsized semiconductor packages have been launched in mass production. For example, ball grid arrays (BGAs), chip size packages (CSPS) and other semiconductor packages are now commercially available.

These BGAs, CSPs and other parts are packed by heating a whole work with infrared ray irradiation and reflowing solder to fix the parts. In this procedure, conventional solder resist films as described in Japanese Examined Patent Application Publication No. 1-54390 may cause defects such as cracking due to heat shock. Demands are therefore made on resist films that have improved impact resistance, adhesion, solder heat resistance, electroless gold plating resistance, PCT resistance and other properties.

Japanese Unexamined Patent Application Publication No. 6-324490 discloses a photosensitive resin which is obtained by allowing a novolak epoxy resin to react with dimethylolpropionic acid having two or more hydroxyl groups per molecule and acrylic acid as an unsaturated monobasic acid, and allowing the resulting product to react with a saturated or unsaturated polybasic acid anhydride. A cured product of this type of photosensitive resins may comprise hydroxyl groups in excess and may therefore exhibit insufficient PCT resistance due to its deteriorated water resistance, since the amount of the added saturated or unsaturated polybasic acid anhydride is less than that of the hydroxyl group of dimethylolpropionic acid, although it has excellent adhesion, solder heat resistance and electroless gold plating resistance. If the amount of saturated or unsaturated polybasic acid anhydride is increased to relatively decrease the amount of hydroxyl groups, the carboxyl groups are in excess to thereby cause insufficient PCT resistance in some cases. The use of an acid having two or more hydroxyl groups, such as dimethylolpropionic acid, induces excess of one of the hydroxyl group and carboxyl group over another and is not preferred.

Accordingly, an object of the present invention is to provide a photosensitive resin composition which is used as a solder resist in printed circuit boards, can be satisfactorily developed in a dilute basic aqueous solution and can yield a cured film that is excellent in flexibility, water resistance, adhesion, solder heat resistance, electroless gold plating resistance and pressure cooker test (PCT) resistance.

SUMMARY OF THE INVENTION

After intensive investigations, the present inventors have solved the conventional problems.

Specifically, the present invention provides a photosensitive resin composition comprising:

(A) a photosensitive resin;

(B) an epoxy resin;

(C) a photopolymerization initiator; and (D) a polymerizable unsaturated compound and/or a solvent, in which the photosensitive resin (A) is obtained by allowing an epoxy resin (a) to react with a compound (b) having one primary alcoholic hydroxyl group and one functional group selected from a carboxyl group and a secondary amino group per molecule, and an unsaturated monobasic acid (c) to yield a reaction product (I) and allowing a saturated or unsaturated polybasic acid anhydride (d) to react with the hydroxyl group of the reaction product (I).

The photosensitive resin (A) in the photosensitive resin composition may be obtained by allowing from 0.6 mole to 1.0 mole inclusive of the saturated or unsaturated polybasic acid anhydride (d) to react with 1 mole of the primary hydroxyl group of the reaction product (I).

In the photosensitive resin (A) of the photosensitive resin composition, 0.8 to 1.2 equivalent weight in total of the compound (b) and the unsaturated monobasic acid (c) including 0.05 to 0.5 equivalent weight of the compound (b) may be allowed to react with 1 equivalent weight of epoxy groups of the epoxy resin (a).

The photosensitive resin composition may comprise 1% to 50% by weight of the epoxy resin (B) based on the total weight of the composition.

The photosensitive resin composition may comprise 0.5% to 20% by weight of the photopolymerization initiator (C) based on the total weight of the composition.

Preferably, the photosensitive resin composition comprises 5% to 80% by weight of the polymerizable unsaturated compound and/or solvent (D) based on the total weight of the composition.

DISCLOSURE OF THE INVENTION

The present invention will be illustrated in further detail below.

Photosensitive resins (A) for use in the present invention are obtained by allowing an epoxy resin (a) to react with a compound (b) having one primary alcoholic hydroxyl group and one functional group selected from a carboxyl group and a secondary amino group per molecule, and an unsaturated monobasic acid (c) to yield a reaction product (I) and allowing a saturated or unsaturated polybasic acid anhydride (d) to react with the hydroxyl group of the reaction product (I).

Examples of the epoxy resin (a) include epoxy resins such as cresol novolak epoxy resins, phenol novolak epoxy resins, dicyclopentadiene-phenol polyaddition epoxy resins and combinations of these resins. These novolak epoxy resins may be halogenated.

Part of such cresol novolak epoxy resins, phenol novolak epoxy resins, dicyclopentadiene-phenol polyaddition epoxy resins may be substituted with other epoxy resins within ranges not deteriorating the advantages of the present invention. Such other epoxy resins include, but are not limited to, bisphenol A epoxy resins, bisphenol F epoxy resins, hydrogenated bisphenol A epoxy resins, phenol-cresol co-condensation epoxy resins, bisphenol A novolak epoxy resins, bisphenol F novolak epoxy resins, triphenylolmethane epoxy resins, tetraphenylolethane epoxy resins and other epoxy resins prepared by allowing polyfunctional phenols to react with epichlorohydrin, epoxy resins prepared by allowing polyfunctional hydroxynaphthalenes to react with epichlorohydrin, silicone-modified epoxy resins, ε-caprolactone-modified epoxy resins, glycidylamine epoxy resins prepared by allowing epichlorohydrin to react with primary or secondary amines, triglycidyl isocyanate and other heterocyclic epoxy resins.

Examples of the compound (b) having one primary alcoholic hydroxyl group and one functional group selected from a carboxyl group and a secondary amino group include glycolic acid, 16-hydroxyhexadecanoic acid and other compounds each having a primary alcoholic hydroxyl group and a carboxyl group; N-benzylethanolamine and other compounds each having a primary alcoholic hydroxyl group and a secondary amino group, of which glycolic acid is typically preferred.

The alcoholic hydroxyl group of the compound (b) is a primary hydroxyl group and has a higher reactivity with respect to the saturated or unsaturated polybasic acid anhydride (d) than a secondary hydroxyl group. Such a secondary hydroxyl group is formed by the reaction of the epoxy group of the epoxy resin (a) with the carboxyl group or secondary amino group of the compound (b) or with a carboxylic acid radical of the unsaturated monobasic acid (c). The saturated or unsaturated polybasic acid anhydride (d) therefore preferentially react with the primary hydroxyl group rather than the secondary hydroxyl group. This photosensitive resin (A) can yield a cured product that has crosslinking points at longer intervals and is more flexible with higher developing property than cured products of conventional photosensitive resins as described in Japanese Examined Patent Application Publication No. 1-54390. Such conventional photosensitive resins are obtained by allowing a novolak epoxy resin to react with acrylic acid as an unsaturated monobasic acid and allowing a saturated or unsaturated polybasic acid anhydride to react with the formed secondary hydroxyl group.

Based on the above mechanism, when the saturated or unsaturated polybasic acid anhydride is added in a number of moles higher than that of the primary hydroxyl group, a primary hydroxyl group derivative in equivalent mole to that of the primary hydroxyl group is always formed, and the cured product of the resulting composition exhibits high flexibility. However, if the amount of the added saturated or unsaturated polybasic acid anhydride is excessively high (if it exceeds 0.7 mole relative to 1 mole of the total hydroxyl group of the reaction product (I)), the cured product exhibits deteriorated PCT resistance. The amount of the saturated or unsaturated polybasic acid anhydride to be added is preferably less than or equal to 0.7 mole, relative to 1 mole of the total hydroxyl groups of the reaction product (I). More preferably, the amount is equal to or more than 0.6 mole and less than or equal to 1.0 mole relative to 1 mole of the primary hydroxyl group of the reaction product (I). If the amount is less than 0.6 mole, the hydroxyl group becomes excessive to thereby deteriorate PCT resistance and developing property.

The unsaturated monobasic acid (c) is a monobasic acid having one carboxyl group and one or more polymerizable unsaturated bonds, of which acrylic acid and methacrylic acid are preferred. Acrylic acid is typically preferred to yield high curability with active light or radiant rays. In addition, such unsaturated monobasic acids include crotonic acid, cinnamic acid, sorbic acid, acrylic acid dimer, monomethyl maleate, monopropyl maleate, monobutyl maleate, and polyfunctional carboxyl-group-containing acrylates or methacrylates which are reaction products of polyfunctional acrylates or methacrylates each having one hydroxyl group and one or more acryloyl groups with dibasic acids among polybasic acid anhydrides mentioned below. Each of these unsaturated monobasic acids can be used in combination.

In the reaction among the epoxy compound (a), the compound (b) and the unsaturated monobasic acid (c), preferably about 0.8 to about 1.2 equivalent weight, and more preferably about 0.9 to about 1.1 equivalent weight, of the total of the compound (b) and the unsaturated monobasic acid (c) is allowed to react with 1 equivalent weight of the epoxy group of the epoxy compound (a). In this reaction, the amount of the compound (b) is preferably 0.05 to 0.5 equivalent weight relative to 1 equivalent weight of the epoxy group of the epoxy compound (a).

In the reaction, a diluent is preferably used. Such diluent include, but are not limited to, methyl ethyl ketone, cyclohexanone and other ketones; toluene, xylene, tetramethylbenzene and other aromatic hydrocarbons; dipropylene glycol dimethyl ether, dipropylene glycol diethyl ether and other glycol ethers; ethyl acetate, butyl cellosolve acetate, carbitol acetate and other esters; octane, decane and other aliphatic hydrocarbons; petroleum ether, petroleum naphtha, hydrogenated petroleum naphtha, solvent naphtha and other petroleum solvents and other organic solvents, as well as carbitol (meth)acrylate, pentaerythritol tetra(meth)acrylate, trimethylolpropane (meth)acrylate, tris(hydroxyethyl) isocyanurate tri(meth)acrylate, dipentaerythritol hexa(meth) acrylate and other reactive monomers. In addition, a catalyst is preferably used to accelerate the reaction. Such catalysts include, for example, triethylamine, benzyldimethylamine, methyltriethylammonium chloride, benzyltrimethylammonium bromide, benzyltrimethylammonium iodide, triphenylphosphine, triphenyl stibine, chromium octanoate and zirconium octanoate. The amount of the catalyst is preferably 0.01% to 1% by weight relative to the weight of the reaction material mixture. The reaction is preferably performed at 60° C. to 150° C. for 5 to 60 hours. Thus, the reaction product (I) can be obtained.

Preferred examples of the saturated or unsaturated polybasic acid anhydride (d) are maleic anhydride, succinic anhydride, itaconic anhydride, phthalic anhydride, tetrahydrophthalic anhydrous, hexahydrophthalic anhydride, endomethylenetetrahydrophthalic anhydride, methyltetrahydrophthalic anhydride, chlorendic anhydride and other dibasic acid anhydrides; trimellitic anhydride, pyromellitic anhydride, benzophenonetetracarboxylic anhydride, biphenyltetracarboxylic anhydride and other polybasic acid anhydrides. Among them, tetrahydrophthalic anhydride, succinic anhydride and hexahydrophthalic anhydride are typically preferably used.

The reaction is preferably performed at 60° C. to 150° C. for 1 to 10 hours.

The content of the photosensitive resin (A) in the composition of the present invention is preferably 10% to 80% by weight and more preferably 15% to 60% by weight based on the total weight of the composition.

The epoxy resin (B) is a thermosetting component and has one or more epoxy groups per molecule. Such epoxy resins include, for example, bisphenol A epoxy resins, bisphenol F epoxy resins, hydrogenated bisphenol A epoxy resins, phenol novolak epoxy resins, cresol novolak epoxy resins, dicyclopentadiene-phenol novolak epoxy resins, phenol-cresol novolak co-condensation epoxy resins, bisphenol A novolak epoxy resins, bisphenol F novolak epoxy resins or halogenated epoxy compounds of these resins, triphenylolmethane epoxy resins, alkyl-substituted triphenylolmethane epoxy resins, tetraphenylolethane epoxy resins and other epoxy resins obtained by allowing polyfunctional phenols to react with epichlorohydrin, epoxy resins obtained by allowing polyfunctional hydroxynaphthalenes to react with epichlorohydrin, silicone-modified epoxy resins, ε-caprolactone-modified epoxy resins, glycidylamine epoxy resins obtained by the reaction between epichlorohydrin and primary or secondary amines, triglycidyl isocyanate and other heterocyclic epoxy resins. Each of these epoxy resins (B) can be used alone or in combination.

The epoxy resins (B) are used to improve properties as the solder resist, such as adhesion, heat resistance and plating resistance.

Each of the epoxy resins (B) is used alone or in combination as a mixture, and the amount of the epoxy resins (B) in the composition of the present invention is preferably 1% to 50% by weight and more preferably 3% to 45% by weight based on the total weight of the composition.

The epoxy resin (B) is preferably used in combination with an epoxy curing agent in order to further improve adhesion, chemical resistance, heat resistance and other properties. Such epoxy curing agents include, for example, imidazoles, amines, guanamines, polyamines, triazine derivatives, tertiary amines, polyphenols, organophosphines, phosphonium salts, quaternary ammonium salts, and photocationic polymerization catalysts. Examples of such epoxy curing agents are imidazoles such as 2-methylimidazole, 2-ethyl-4-methylimidazole, 2-phenylimidazole, 2-phenylimidazole, 2-undecylimidazole, 2-heptadecylimidazole, 1-benzyl-2-methylimidazole, 2-phenyl-4-methylimidazole, 1-cyanoethyl-2-methylimidazole, 1-cyanoethyl-2-phenylimidazole, 1-cyanoethyl-2-undecylimidazole, 2-phenyl-4,5-bis(hydroxymethyl)imidazole and 2-alkylformylimidazoles; guanamines such as acetoguanamine and benzoguanamine; amines such as diaminodiphenylmethane, m-phenylenediamine, m-xylylenediamine, diaminodiphenyl sulfone, dicyandiamide, urea and urea derivatives; guanamines such as acetoguanamine and benzoguanamine; polyamines such as melamine, polybasic hydrazide, or organic acid salts and/or epoxy adducts of these compounds, and boron trifluoride amine complex; triazine derivatives such as ethylamino-S-triazine, 2,4-diamino-S-triazine, 2,4-diamino-S-triazine and 2,4-diamino-6-xylyl-S-triazine; tertiary amines such as trimethylamine, triethanolamine, N,N-dimethyloctylamine, N-benzyldimethylamine, pyridine, N-methylmorpholine, hexa(N-methyl)melamine, 2,4,6-tris(dimethylaminophenol) and tetramethylguanidine; polyphenols such as polyvinylphenol, polyvinylphenol bromides, phenol novolaks, and alkylphenol novolaks; organophosphines such as tributylphosphine, triphenylphosphine and tris-2-cyanoethylphosphine; phosphonium salts such as tri-n-butyl(2,5-dihydroxyphenyl)phosphonium bromide, hexadecyltributylphosphonium bromide and hexadecyltributylphosphonium bromide; quaternary ammonium salts such as benzyltrimethylammonium chloride, phenyltributylammonium chloride and other derivatives; as well the aforementioned saturated or unsaturated polybasic acid anhydrides, diphenyliodonium tetrafluoroborate, triphenylsulfonium hexafluoroantimonate, 2,4,6-triphenylthiopyridinium hexafluorophosphate, iron-arene complexes and other photocationic polymerization catalysts; conventional curing agents or curing accelerators for use in the reaction of styrene-maleic acid resin. Each of these compounds can be used alone or in combination. The amount of the epoxy resin curing agent is preferably 0.01 to 25 parts by weight and more preferably 0.1 to 15 parts by weight relative to 100 parts by weight of the epoxy resin (B).

The photopolymerization initiator (C) includes, for example, benzoins, acetophenones, anthraquinones, thioxanthones and benzophenones. Examples of these compounds are benzoins such as benzoin and benzoin methyl ether, benzoin isopropyl ether and other benzoin derivatives; acetophenones such as acetophenone, 2,2-dimethoxy-2-phenylacetophenone and other acetophenone derivatives; anthraquinones such as 2-methylanthraquinone, 2-chloroanthraquinone, 2-ethylanthraquinone, 2-t-butylanthraquinone, and other anthraquinone derivatives; thioxanthones such as thioxanthone, 2,4-dimethylthioxanthone and other thioxanthone derivatives; benzophenones such as benzophenone, 4-benzoyl-4'-methyldiphenyl sulfide, 4,4'-dichlorobenzophenone, N,N-dimethylaminobenzophenone and other benzophenone derivatives, as well as 2,4,6-trimethylbenzoyldiphenylphosphine oxide. Each of these compounds can be used alone or in combination. The photopolymerization initiator (C) can be used in combination with one or more types of photosensitizers such as tertiary amines. Such tertiary amines include, for example, ethyl N,N-dimethylaminobenzoate, isoamyl N,N-dimethylaminobenzoate, pentyl-4-dimethylaminobenzoate, triethylamine and triethanolamine.

Preferably, 2-ethyl-1-[4-(methylthio)phenyl]-2-morpholinolpropan-1-one is used in combination with at least one selected from 2,4-diethylthioxanthone, 4-benzoylthioxanthone and 2-isopropylthioxanthone.

The amount of the photopolymerization initiator (C) is preferably 0.5% to 20% by weight and more preferably 1% to 10% by weight based on the total weight of the composition of the present invention.

As a diluent, the polymerizable unsaturated compound and/or solvent (D) can be used. This component is used in order to improve coatability when a curable and/or photosensitive resin composition with respect to active light or radiant ray is used as a resist ink.

As such polymerizable unsaturated compounds, monomers that can be cured with active light or radiant ray are preferred. Such monomers include, for example, 2-hydroxyethyl acrylate, 2-hydroxypropyl acrylate, isoamyl acrylate, butoxyethyl acrylate, methoxypolyethylene glycol acrylate, ethoxypolyethylene glycol acrylate, melamine acrylate, phenoxyethyl acrylate, phenoxypropyl acrylate, ethylene glycol diacrylate, dipropylene glycol diacrylate, poly(dipropylene glycol diacrylate), phenyl glycidyl ether acrylate-tolylene diisocyanate urethane prepolymer, PO-modified bisphenol A diacrylate, N-pyrrolidone, N-acryloylmorpholine, N,N-dimethylacrylamide, N,N-diethylacrylamide, N,N-dimethylaminoethyl acrylate, N,N-dimethylaminopropyl acrylate, trimethylolpropane triacrylate, pentaerythritol triacrylate, pentaerythritol tetraacrylate, dipentaerythritol hexaacrylate, glycerol diacrylate, isobornyl acrylate, dicyclopentenyloxyethyl acrylate, and methacrylates corresponding to these acrylates. Each of these polymerizable unsaturated compounds can be used alone or in combination.

The solvents include, for example, ketones, aromatic hydrocarbons, carbitols and acetates. Examples of such solvents are ketones such as methyl ethyl ketone, methyl isobutyl ketone and cyclohexanone; aromatic hydrocarbons such as toluene and xylene; carbitols such as ethyl cellosolve, butyl cellosolve, carbitol and butyl carbitol; acetates such as ethyl acetate, butyl acetate, cellosolve acetate, butyl cellosolve acetate and carbitol acetate. Each of these solvents can be used alone or in combination.

Each of the polymerizable unsaturated compounds and/or solvents (D) can be used alone or in combination as a mixture. The amount of the component (D) is preferably from 5% to 80% by weight and more preferably from 10% to 70% by weight based on the total weight of the photosensitive resin composition of the present invention.

When the photosensitive resin composition of the present invention is used as a liquid resist ink, it may further comprise additives according to necessity. Such additives include, for example, silica, calcium carbonate, barium sulfate, clay, talc and other inorganic fillers; phthalocyanine green, phthalocyanine blue, titanium oxide, carbon black and other coloring pigments; defoaming agents; and leveling agents; as well as hydroquinone, resorcinol, catechol, pyrogallol, hydroquinone monomethyl ether, t-butylcatechol, phenothiazine and other polymerization inhibitors. The amount of these additives is preferably 0% to 60% by weight and more preferably 5% to 40% by weight based on the total weight of the photosensitive resin composition of the present invention.

The photosensitive resin composition may further comprise copolymers of ethylenically unsaturated compounds, polyester resins and other conventional binder resins; polyester (meth)acrylate, polyurethane (meth)acrylate, epoxy (meth)acrylate and other unsaturated group-containing polymerizable oligomers, within ranges not adversely affecting the properties as a solder resist.

The photosensitive resin composition of the present invention is obtained by compounding the individual components preferably in the aforementioned proportions and homogeneously blending them using, for example, a triple roll mill.

The photosensitive resin composition of the present invention is cured, for example, in the following manner and thereby yields a cured product. Specifically, the composition of the present invention is applied onto a printed circuit board to a thickness of 10 to 160 μm by screen printing, spraying, roll coater coating, electrostatic painting, curtain coating or another technique, the resulting film is dried at 60° C. to 110° C., a negative film is brought into direct contact with the film or is placed on the film without contact, the film is then irradiated with ultraviolet rays, the unexposed portions of the film are then dissolved and removed (developed) with a dilute basic aqueous solution (e.g., 0.5% to 2% sodium carbonate aqueous solution or sodium hydroxide aqueous solution), and the film is further sufficiently cured by ultraviolet rays irradiation and/or heating (e.g., heating at 100° C. to 200° C. for 0.5 to 1.0 hour) to further improve the physical properties and thereby yields a cured film.

BEST MODE FOR CARRYING OUT THE INVENTION

The present invention will be illustrated in further detail with reference to several examples and comparative examples below. All parts and percentages are by weight unless otherwise specified.

SYNTHESIS EXAMPLE 1
Synthesis Example of Photosensitive Resin (A-1)

A total of 2100 parts (10 equivalent weight) of a cresol novolak epoxy resin (available from Tohto Kasei Co., Ltd. under the trade name of Epotohto YDCN-704, softening point: 80° C., epoxy equivalent: 210), 576 parts (8 moles) of acrylic acid, 152 parts (2 moles) of glycolic acid, 2.8 parts of methylhydroquinone and 2097 parts of carbitol acetate were mixed, the resulting mixture was heated to 90° C. and thereby yielded a homogenous solution. Thereafter, the resulting solution was mixed with 14.1 parts of triphenylphosphine, was heated to 100° C., was allowed to react for about 40 hours and thereby yielded a reaction product having an acid value of 0.5 KOH-mg/g (hydroxyl group 12 equivalent weight). The reaction product was mixed with 301 parts (1.98 moles; the ratio of tetrahydrophthalic anhydride to 1 mole of primary hydroxyl group of the resulting reaction product (I) was 0.99 mole) of tetrahydrophthalic anhydride, was heated to 95° C., was allowed to react for about 6 hours and thereby yielded a photosensitive resin (A-1) having an acid value in solids of 36 KOH-mg/g and a solid concentration of 60%. H-NMR and $^{13}$C-NMR analyses revealed that the primary hydroxyl group disappeared from the photosensitive resin (A-1).

SYNTHESIS EXAMPLES 2 TO 8

A series of photosensitive resins (A-2), (A-3), (A-4), (A-5), (B-1), (B-2) and (B-3) each having a solid concentration of 60% were obtained in the same manner as in Synthesis Example 1, except that the charged amounts of the cresol novolak epoxy resin, acrylic acid, glycolic acid, methylhydroquinone, carbitol acetate, triphenylphosphine and tetrahydrophthalic anhydride in Synthesis Example 1 were changed as shown in Table 1 or 2.

SYNTHESIS EXAMPLE 9

A total of 2200 parts (10 equivalent weight) of cresol novolak epoxy resin (available from Nippon Kayaku Co., Ltd. under the trade name of EOCN-104S, softening point: 92° C., epoxy equivalent: 220), 134 parts (1 mole) of dimethylolpropionic acid, 648.5 parts (9 moles) of acrylic acid, 4.6 parts of methylhydroquinone, 1131 parts of carbitol acetate and 484.9 parts of solvent naphtha were mixed, the resulting mixture was heated to 90° C. and was stirred to thereby dissolve the resulting reaction mixture. The reaction mixture was cooled to 60° C., was mixed with 13.8 parts of triphenylphosphine, was heated to 100° C., was allowed to react for about 32 hours and thereby yielded a reaction product having an acid value of 0.5 mg-KOH/g (hydroxyl group: 12 equivalent weight). The reaction product was then mixed with 702 parts (4.6 moles) of tetrahydrophthalic anhydride, 264.7 parts of carbitol acetate and 113.5 parts of solvent naphtha, was heated to 95° C., was allowed to react for about 6 hours, was cooled and thereby yielded a photosensitive resin (B-4) having an acid value of solid contents of 70 mg-KOH/g and a solid concentration of 65%.

TABLE 1

| Synthesis Example | 2 | 3 | 4 | 5 |
|---|---|---|---|---|
| Cresol novolac epoxy resin | 2100 (10 eq) | 2100 (10 eq) | 2100 (10 eq) | 2100 (10 eq) |
| Acrylic acid | 504 (7 mol) | 504 (7 mol) | 432 (6 mol) | 525.6 (7.3 mol) |
| Glycolic acid | 228 (3 mol) | 228 (3 mol) | 304 (4 mol) | 205.2 (2.7 mol) |
| Dimethylolpropionic acid | 0 (0 mol) | 0 (0 mol) | 0 (0 mol) | 0 (0 mol) |
| Methylhydroquinone | 2.8 | 2.8 | 2.8 | 2.8 |
| Carbitol acetate | 2153 | 2200 | 2206 | 2202 |

TABLE 1-continued

| Synthesis Example | 2 | 3 | 4 | 5 |
|---|---|---|---|---|
| Triphenylphosphine | 14.1 | 14.1 | 14.1 | 14.1 |
| Tetrahydrophthalic anhydride | 380 (2.5 mol) | 451 (2.97 mol) | 456 (3.0 mol) | 456 (3.0 mol) |
| Ratio of tetrahydrophthalic anhydride to primary hydroxyl group of (I) | 0.83 | 0.99 | 0.75 | 1.11 |
| Acid value in solids (KOH-mg/g) | 44 | 51 | 51 | 51 |
| Photosensitive resin | A-2 | A-3 | A-4 | A-5 |

TABLE 2

| Synthesis Example | 6 | 7 | 8 | 9 |
|---|---|---|---|---|
| Cresol novolac epoxy resin | 2100 (10 eq) | 2100 (10 eq) | 2100 (10 eq) | 2200 (10 eq) |
| Acrylic acid | 504 (7 mol) | 720 (10 mol) | 720 (10 mol) | 648.5 (9 mol) |
| Glycolic acid | 0 (0 mol) | 0 (0 mol) | 0 (0 mol) | 0 (0 mol) |
| Dimethylolpropionic acid | 402 (3 mol) | 0 (0 mol) | 0 (0 mol) | 134 (1 mol) |
| Methylhydroquinone | 2.8 | 2.8 | 2.8 | 4.6 |
| Carbitol acetate | 2257 | 2691 | 1931 | 1395.7 |
| Triphenylphosphine | 14.1 | 14.1 | 14.1 | 13.8 |
| Tetrahydrophthalic anhydride | 380 (2.5 mol) | 1216 (8.0 mol) | 76 (0.5 mol) | 702.3 (4.6 mol) |
| Ratio of tetrahydrophthalic anhydride to primary hydroxyl group of (I) | 0.42 | — | — | 0.225 |
| Acid value in solids (KOH-mg/g) | 42 | 111 | 10 | 70 |
| Photosensitive resin | B-1 | B-2 | B-3 | B-4 |

Using each of the photosensitive resins obtained in the synthesis examples, ink compositions (i) and (ii) were compounded and were kneaded in a triple roll mill, respectively, and 500 g of the ink composition (i) and 128 g of the ink composition (ii) were then mixed with each other and thereby yielded a photosensitive resin composition (iii). The photosensitive resin composition (iii) was applied onto a buffed and patterned printed circuit board to a thickness on wet basis of 40 to 80 μm by screen printing using a 100-mesh polyester screen. The resulting film was dried using a hot air dryer at 85° C. for a predetermined time, the dried film was brought into intimate contact with a negative film carrying a patterned resist and was then irradiated with ultraviolet rays at a dose of 350 mJ/cm$^2$ using an UV aligner. Next, the negative film was removed off, the unexposed portions of the coated film were dissolved and removed by development with 1% sodium carbonate aqueous solution at a spray pressure of 2.0 kg/cm$^2$ for 60 seconds, and developing property was determined. The resulting film was then heated and cured using a hot air dryer at 150° C. for 20 minutes and thereby yielded test pieces for the following adhesion, solder heat resistance, gold plating resistance, PCT resistance and flexibility tests. The results of these tests are shown in Tables 4 and 5. The photosensitive resin compositions using the resins obtained in Synthesis Examples 1 to 5 were evaluated as Examples 1 to 5, respectively. The photosensitive resin compositions using the resins obtained in Synthesis Examples 6 to 9 were evaluated as Comparative Examples 1 to 4, respectively.

TABLE 3

| Component | Name | Amount |
|---|---|---|
| Ink Composition (i) | | |
| | Photosensitive resin | 308.0 parts |
| Photopolymerization initiator | Irgacure 907 | 24.0 parts |
| | Kayacure DETX-S | 1.0 part |
| Diluent | Carbitol acetate | 10.0 parts |
| | Solvesso 150 | 10.0 parts |
| | DPE-6A | 20.0 parts |
| Others | Fuselex | 109.4 parts |
| | Aerosil 380 | 10.0 parts |
| | Phthalocyanine green | 3.6 parts |
| | Dicyandiamide | 2.0 parts |
| | Total | 500.0 parts |
| Ink Composition (ii) | | |
| Thermosetting component | YDCN-704 | 9.0 parts |
| | TEPIC | 37.0 parts |
| Diluent | LIGHT-ACRYLATE TMP-A | 18.0 parts |
| | Carbitol acetate | 18.0 parts |
| | Solvesso 150 | 9.0 parts |
| Others | Barium sulfate | 37.0 parts |
| | Total | 128.0 parts |

Developing Property

In the above procedure, the films were dried for 20 minutes, 40 minutes, 60 minutes, 80 minutes and 100 minutes, respectively, and the resulting films were visually inspected using a magnifier to thereby determine the developing property according to the following criteria: Good: The ink was completely removed during development and the film was satisfactorily developed. Poor: The film had any undeveloped portion after development.

Adhesion

According to the method specified in Japanese Industrial Standards (JIS) D 0202, a cured film under test was scribed to form crosscut sections. A cellophane adhesive tape was applied to the crosscut film and then peeled off therefrom, and the film was visually observed to inspect whether or not the crosscut sections were peeled off. The adhesion of the film was determined according to the following criteria: Good: No peeling was observed. Fair: A few of crosscut sections were peeped off. Poor: The film was peeled off.

Solder Heat Resistance

A test piece was dipped in a bath of molten solder at 260° C. for 10 minutes, this procedure was repeated three times as a total, and the test piece was then visually inspected according to the method specified in JIS C 6481. The solder heat resistance was then determined according to the following criteria: Good: The cured film showed no change in appearance. Fair: The cured film changed in color. Poor: The cured film showed lifting, peeling or solder wicking or webbing.

Electroless Gold Plating Resistance

A test piece was subjected to the following pretreatment. Specifically, it was subjected to dipping in an acidic degreasing agent solution at 30° C., dipping in water for rinsing, soft etching, dipping in water for rinsing, mixing with a catalyst (dipping in a nickel plating catalyst solution at 30° C. for 7 minutes) and dipping in water for rinsing in this order, followed by electroless nickel plating. In the electroless nickel plating process, the test piece was dipped in a nickel plating solution pH 4.6 at 85° C. for 20 minutes, was then dipped in an acid (10 vol. % sulfuric acid aqueous solution)

at room temperature for 1 minute and was dipped in water for rinsing, followed by electroless gold plating. In the electroless gold plating process, the test piece was dipped in a gold plating solution (3 vol. % potassium cyanoaurate aqueous solution, pH 6) at 95° C. for 10 minutes, was dipped in water for rinsing, was dipped in hot water at 60° C. for rinsing, was further sufficiently rinsed with water, was sufficiently drained and was dried in this order to thereby complete the electroless gold plating process. The test piece was then visually inspected, was subjected to a peeling test using a cellophane adhesive tape and the resulting film was observed. The electroless gold plating resistance was determined according to the following criteria: Good: The test piece showed no change in appearance and no resist peeling. Fair: The test piece showed no change in appearance but showed slight resist peeling. Poor: The test piece showed resist floating and plate wicking or webbing, and the resist significantly peeled off in the peeling test.

PCT Test

A test piece was left stand at 121° C. in an atmosphere of saturated vapor at 2 atm for 100 hours, and the resulting film was visually inspected to determine the PCT resistance according to the following criteria: Good: The film was neither blistered nor peeled. Poor: The film was blistered and/or peeled.

Flexibility Test

A test piece was subjected to a flexibility test according to the method specified in JIS K5400 using an Erichsen tester specified in the method A of JIS B7729. Specifically, the photosensitive resin composition (iii) was applied onto a bonderized plate, was dried, was irradiated with light or rays, was developed, was heated in this order, and a rigid ball was pushed from the back side of the resulting test piece to thereby deform the test piece, and the distance covered by the pushed rigid ball until the film was cracked or peeled off was determined. The flexibility was then determined according to the following criteria: Good: The film was neither cracked nor peeled off even the rigid ball was pushed 3 mm or more. Fair: The film was cracked and peeled off when the rigid ball was pushed equal to or more than 3 mm and less than 4 mm. Poor: The film was cracked and peeled off when the rigid ball was pushed less than 3 mm.

In the composition of Table 3, Irgacure 907 is 2-methyl-1-[4-(methylthio)phenyl]-2-morpholino-propan-1-one available from Ciba Geigy Ltd., Kayacure DETX-S is 2,4-diethylthioxanthone available from Nippon Kayaku Co., Ltd., Solvesso 150 is solvent naphtha available from ExxonMobil Chemical, LIGHT-ACRYLATE DPE-6A is a mixture of dipentaerythritol hexaacrylate and dipentaerythritol pentaacrylate available from Kyoeisha Chemical Co., Ltd., Fuselex is a fused silica available from Tatsumori Co., Aerosil 380 is anhydrous silica available from Nippon Aerosil Co., Ltd., YDCN-704 is a o-cresol novolak epoxy resin available from Tohto Kasei Co., Ltd., TEPIC is triglycidyl ether isocyanurate available from Nissan Chemical Industries, Ltd., and LIGHT-ACRYLATE TMP-A is trimethylolpropane triacrylate available from Kyoeisha Chemical Co., Ltd.

TABLE 4

| | Photo-sensitive resin | Time (min.) of drying the coating at 85° C. | | | | |
|---|---|---|---|---|---|---|
| | | 20 | 40 | 60 | 80 | 100 |
| Ex. 1 | A-1 | Good | Good | Poor | Poor | Poor |
| Ex. 2 | A-2 | Good | Good | Good | Poor | Poor |
| Ex. 3 | A-3 | Good | Good | Good | Good | Good |
| Ex. 4 | A-4 | Good | Good | Good | Good | Good |
| Ex. 5 | A-5 | Good | Good | Good | Good | Good |
| Com. Ex. 1 | B-1 | Good | Good | Poor | Poor | Poor |
| Com. Ex. 2 | B-2 | Good | Poor | Poor | Poor | Poor |
| Com. Ex. 3 | B-3 | Poor | Poor | Poor | Poor | Poor |
| Com. Ex. 4 | B-4 | Good | Good | Poor | Poor | Poor |

TABLE 5

| | Photo-sensitive resin | Tests | | | | |
|---|---|---|---|---|---|---|
| | | Adhesion | Solder heat resistance | Electroless gold plating resistance | PCT resistance | Flexibility |
| Ex. 1 | A-1 | Good | Good | Good | Good | Good |
| Ex. 2 | A-2 | Good | Good | Good | Good | Good |
| Ex. 3 | A-3 | Good | Good | Good | Good | Good |
| Ex. 4 | A-4 | Good | Good | Good | Good | Good |
| Ex. 5 | A-5 | Good | Good | Good | Good | Good |
| Com. Ex. 1 | B-1 | Good | Good | Fair | Poor | Good |
| Com. Ex. 2 | B-2 | Fair | Poor | Poor | Poor | Poor |
| Com. Ex. 3 | B-3 | Poor | Poor | Poor | Poor | Poor |
| Com. Ex. 4 | B-4 | Good | Good | Poor | Poor | Fair |

The results are of coatings that were dried at 85° C. for 20 minutes and were then cured under the aforementioned conditions.

The results in Tables 4 and 5 show that the photosensitive resin compositions of the present invention can be satisfactorily developed in a dilute basic aqueous solution and can be developed even when the solvent is removed by long-term drying and can yield cured products that have excellent adhesion, solder heat resistance, electroless gold plating resistance, PCT resistance and flexibility.

REFERENCE EXAMPLE

To verify whether or not an acid anhydride is preferentially added to a primary hydroxyl group, a reference test was performed using a compound having a primary hydroxyl group and a compound having a secondary hydroxyl group.

Into 152 parts (1 mole) of tetrahydrophthalic anhydride heated at 95° C., 130 parts (1 mole) of 1-octanol as the compound having a primary hydroxyl group and 130 parts (1 mole) of 2-octanol as the compound having a secondary hydroxyl group were added, and the resulting mixture was allowed to react at 100° C. for about 3 hours. IR analysis of the resulting reaction product revealed that the absorption of the acid anhydride disappeared. The reaction rate of the reaction product was determined by Gel permeation chromatography (GPC) and revealed that the addition rate of tetrahydrophthalic anhydride was 99% or more three hours into the reaction. In addition, H-NMR and $^{13}$C-NMR analyses on the reaction product revealed that the primary hydroxyl group disappeared and the secondary hydroxyl group did not disappeared. These results show that the acid anhydride is preferentially added to the primary hydroxyl group.

INDUSTRIAL APPLICABILITY

In solder resist patterning in which a film is selectively irradiated with ultraviolet rays through a patterned film and the unexposed portions of the film are removed by development, the photosensitive resin composition of the present invention is resistant to developing solutions in exposed portions and can yield a cured product that is excellent in electroless gold plating resistance and have satisfactory adhesion, solder heat resistance, PCT resistance and other properties. The photosensitive resin composition is therefore specifically suitable as a photosensitive resin composition for use as a liquid solder resist.

The present invention can therefore provide a photosensitive resin composition which is used as a solder resist in printed circuit boards, can be satisfactorily developed in a dilute basic aqueous solution and can yield a cured film that is excellent in flexibility, water resistance, adhesion, solder heat resistance, electroless gold plating resistance and pressure cooker test (PCT) resistance.

What is claimed is:

1. A photosensitive resin composition comprising:
    (A) a photosensitive resin;
    (B) an epoxy resin;
    (C) a photopolymerization initiator; and
    (D) a polymerizable unsaturated compound and/or a solvent,
    wherein the photosensitive resin (A) is obtained by allowing an epoxy resin (a) to react with a compound (b) having only one primary alcoholic hydroxyl group and one functional group selected from a carboxyl group and a secondary amino group per molecule and an unsaturated monobasic acid (c) to yield a reaction product (I) and allowing a saturated or unsaturated polybasic acid anhydride (d) to react with the hydroxyl group of the reaction product (I).

2. The photosensitive resin composition according to claim 1, wherein the photosensitive resin (A) is obtained by allowing from 0.6 mole to 1.0 mole inclusive of the saturated or unsaturated polybasic acid anhydride (d) to react with 1 mole of the primary hydroxyl group of the reaction product (I).

3. The photosensitive resin composition according to claim 1, wherein 0.8 to 1.2 equivalent weight in total of the compound (b) and the unsaturated monobasic acid (c) including 0.05 to 0.5 equivalent weight of the compound (b) is allowed to react with 1 equivalent weight of epoxy groups of the epoxy resin (a) in the photosensitive resin (A).

4. The photosensitive resin composition according to claim 1, wherein the composition comprises 1% to 50% by weight of the epoxy resin (B) based on the total weight of the composition.

5. The photosensitive resin composition according to claim 1, wherein the composition comprises 0.5% to 20% by weight of the photopolymerization initiator (C) based on the total weight of the composition.

6. The photosensitive resin composition according to claim 1, wherein the composition comprises 5% to 80% by weight of the polymerizable unsaturated compound and/or solvent (D) based on the total weight of the composition.

7. The photosensitive resin composition according to claim 2, wherein 0.8 to 1.2 equivalent weight in total of the compound (b) and the unsaturated monobasic acid (c) including 0.05 to 0.5 equivalent weight of the compound (b) is allowed to react with 1 equivalent weight of epoxy groups of the epoxy resin (a) in the photosensitive resin (A).

8. The photosensitive resin composition according to claim 2, wherein the composition comprises 1% to 50% by weight of the epoxy resin (B) based on the total weight of the composition.

9. The photosensitive resin composition according to claim 2, wherein the composition comprises 0.5% to 20% by weight of the photopolymerization initiator (C) based on the total weight of the composition.

10. The photosensitive resin composition according to claim 2, wherein the composition comprises 5% to 80% by weight of the polymerizable unsaturated compound and/or solvent (D) based on the total weight of the composition.

* * * * *